(12) United States Patent
Xiao et al.

(10) Patent No.: US 10,768,533 B2
(45) Date of Patent: Sep. 8, 2020

(54) METHOD AND SYSTEM FOR GENERATING PROGRAMMED DEFECTS FOR USE IN METROLOGY MEASUREMENTS

(71) Applicant: KLA-Tencor Corporation, Milpitas, CA (US)

(72) Inventors: Hong Xiao, Pleasanton, CA (US); Nadav Gutman, Zichron Ya'agov (IL)

(73) Assignee: KLA-Tencor Corporation, Milpitas, CA (US)

( * ) Notice: Subject to any disclaimer, the term of this patent is extended or adjusted under 35 U.S.C. 154(b) by 237 days.

(21) Appl. No.: 15/730,551

(22) Filed: Oct. 11, 2017

(65) Prior Publication Data

US 2018/0113387 A1 Apr. 26, 2018

Related U.S. Application Data

(60) Provisional application No. 62/410,397, filed on Oct. 20, 2016.

(51) Int. Cl.
| | |
|---|---|
| *G03F 7/20* | (2006.01) |
| *G01N 21/95* | (2006.01) |
| *H01J 37/28* | (2006.01) |
| *H01L 21/66* | (2006.01) |

(52) U.S. Cl.
CPC ..... *G03F 7/70633* (2013.01); *G01N 21/9501* (2013.01); *G03F 7/70466* (2013.01); *G03F 7/70683* (2013.01); *H01J 37/28* (2013.01); *G06T 2207/30148* (2013.01); *H01L 22/12* (2013.01); *H01L 22/30* (2013.01)

(58) Field of Classification Search
USPC ......................................................... 716/51
See application file for complete search history.

(56) References Cited

U.S. PATENT DOCUMENTS

| | | |
|---|---|---|
| 2003/0201410 A1 | 10/2003 | Nagamura |
| 2008/0170780 A1 | 7/2008 | Cramer et al. |
| 2012/0123581 A1* | 5/2012 | Smilde ................ G03F 7/70483 700/105 |

(Continued)

OTHER PUBLICATIONS

International Search Report and Written Opinion dated Feb. 5, 2018 for PCT/US2017/057453.

(Continued)

*Primary Examiner* — Eric D Lee
(74) *Attorney, Agent, or Firm* — Suiter Swantz pc llo

(57) ABSTRACT

A system for generating and implementing programmed defects includes a lithography tool configured to form a multi-pattern structure including a first array pattern and a second array pattern on a sample. The first array pattern or the second array pattern contains a programmed defect to differentiate the first array pattern from the second array pattern. The system includes a metrology tool configured to acquire one or more images of the first array pattern and the second array pattern having a field-of-view containing the programmed defect. The system includes a controller including one or more processors. The one or more processors are configured to receive the images of the first array pattern and the second array pattern from the metrology, and determine a metrology parameter associated with the first array pattern or the second array pattern.

38 Claims, 11 Drawing Sheets

(56) References Cited

U.S. PATENT DOCUMENTS

2015/0042978 A1* 2/2015 Lynch ................. H01L 22/12
356/36
2016/0018742 A1 1/2016 Van De Kerkhof et al.

OTHER PUBLICATIONS

Osamu Inoue et al., "SEM based overlay measurement between resist and buried patterns", Proceeding of SPIE Advanced Lithography, Metrology, Inspection, and Process Control for Microlithography, vol. 9778, 97781D, 9 pages, Apr. 27, 2016.

* cited by examiner

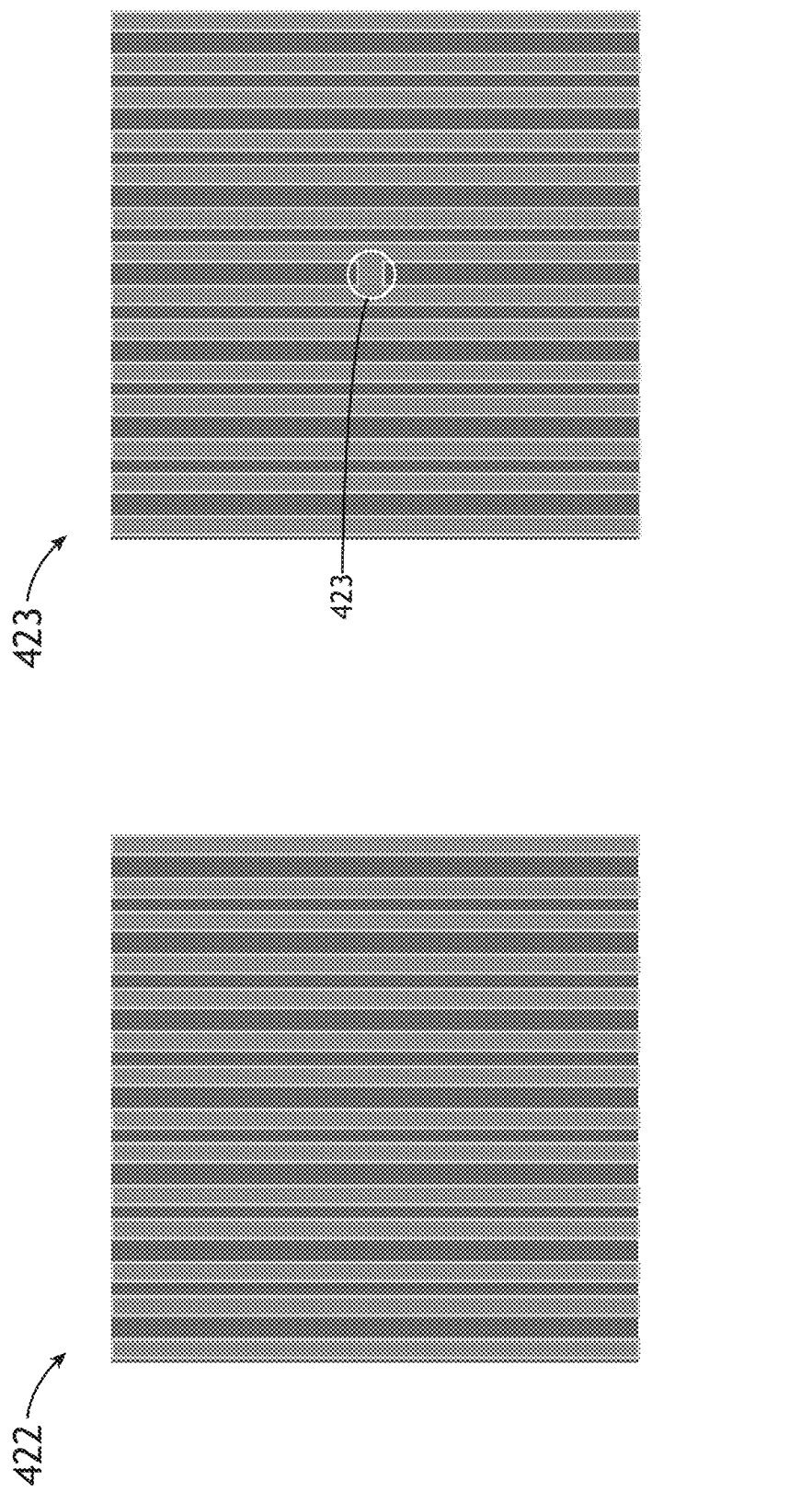

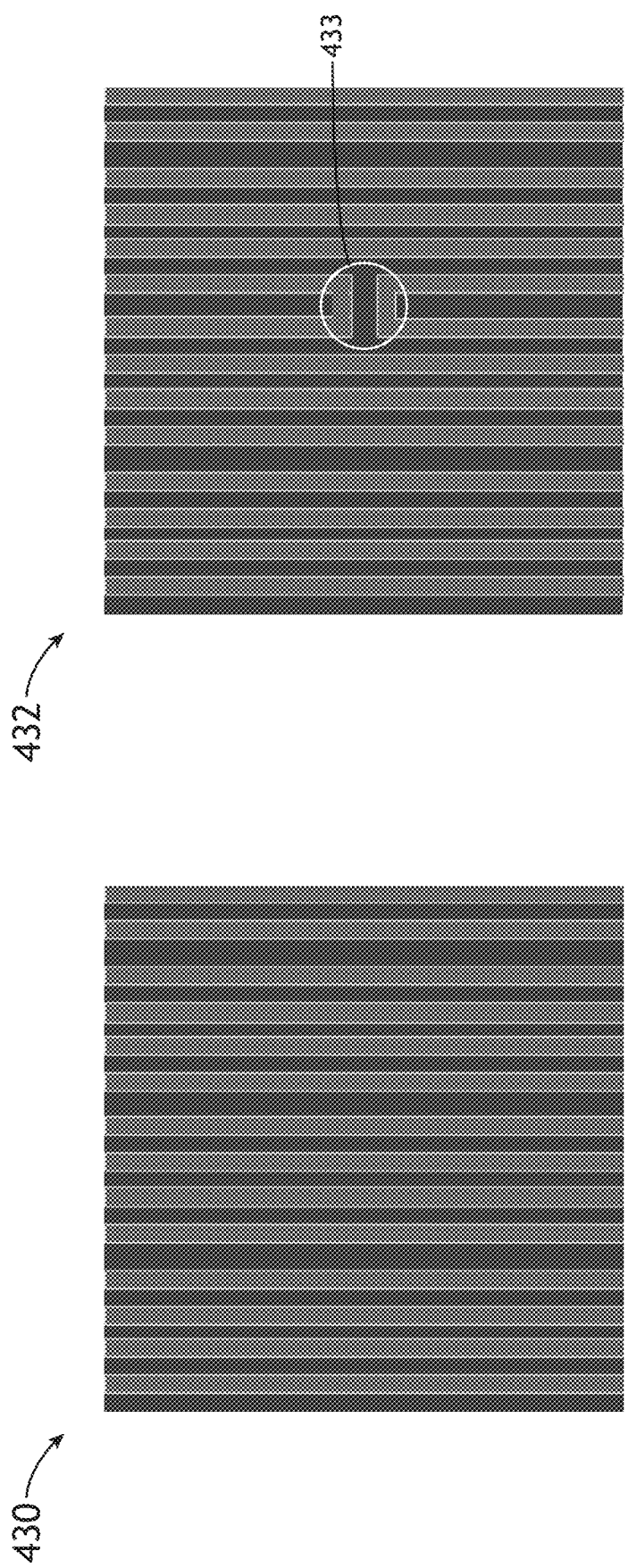

METHOD AND SYSTEM FOR GENERATING PROGRAMMED DEFECTS FOR USE IN METROLOGY MEASUREMENTS

CROSS-REFERENCE TO RELATED APPLICATION

The present application claims benefit under 35 U.S.C. § 119(e) and constitutes a regular (non-provisional) patent application of U.S. Provisional Application Ser. No. 62/410,397, filed Oct. 20, 2016, entitled DESIGNED DEFECTS FOR SEM-BASED CDU AND OVERLAY MEASUREMENTS IN ARRAY PATTERNS FORMED WITH MULTIPLE PATTERNING PROCESSES, naming Hong Xiao as an inventor, which is incorporated herein by reference in the entirety.

TECHNICAL FIELD

The present invention generally relates to image-based metrology, and, in particular, to the generation and application of programmed defects in patterns formed via multiple pattern processes to enhance metrology measurements performed via scanning electron microscopy.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size become smaller and smaller, it becomes critical to develop enhanced monitoring and review devices and procedures. Overlay measurements may currently be performed using an optical measurement system on overlay targets placed in the scribe line of a die of a semiconductor device following an "after development inspection" (ADI) step. This approach is typically fast and in cases where results are out of specification, the sample (e.g., semiconductor wafer) may be reworked. As device feature size continues to scale down and multi-patterning processes become more widely used in integrated circuits (IC) chip manufacturing, overlay control become much tighter. In addition, optical overlay measurement on scribe line at the ADI step is no longer sufficient for overlay control of real IC device at an "after etch inspection" (AEI) step. As a result, the use of scanning electron microscope (SEM) overlay measurements at the AEI step in device patterns becomes necessary.

Currently, SEM overlay targets are designed with a line-space array pattern, which must be measured at the border of a first mask and a second mask so that the patterns from the two layers can be identified. Such an approach is limited in that it can only be performed at the array boarder. The approach may be formed on either test patterns or device patterns, which typically are patterned differently from the array center due to the loading effect, which has a negative impact on measurement results. Therefore, a system and method that cures the shortcomings of previous multi-pattern measurement approaches is desired.

SUMMARY

A system for generating and implementing programmed defects within a multi-pattern structure to enhance metrology measurements is described in accordance with one or more embodiments of the present disclosure. In one embodiment, the system includes a lithography tool configured to form a multi-pattern structure including a first array pattern and a second array pattern on a sample, wherein at least one of the first array pattern or the second array pattern contains a programmed defect to differentiate the first array pattern from the second array pattern. In another embodiment, the system includes a metrology tool configured to acquire one or more images of the first array pattern and the second array pattern having a field-of-view containing the programmed defect. In another embodiment, the system includes a controller including one or more processors, wherein the one or more processors are configured to cause the one or more processors to execute a set of program instructions contained in memory. In another embodiment, the set of program instructions are configured to cause the one or more processors to receive the one or more images of the first array pattern and the second array pattern from the metrology tool. In another embodiment, the set of program instructions are configured to cause the one or more processors to determine one or more metrology parameters associated with at least one of the first array pattern and the second array pattern.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 4F illustrates an SADP structure depicting the difficulty in identifying the root cause associated with the pitch walk of the SADP in the context of mandrel CD variation and an SADP structure formed with a programmed defect, in accordance with one or more embodiments of the present disclosure.

FIG. 4G illustrates a self-aligned quadruple pattern (SAQP) structure illustrating the difficulty in identifying the root cause associated with the pitch walk of the SAQP, in accordance with one or more embodiments of the present disclosure.

FIG. 4H depicts a SAQP structure formed with a bridge defect, in accordance with one or more embodiments of the present disclosure.

DETAILED DESCRIPTION OF THE INVENTION

Reference will now be made in detail to the subject matter disclosed, which is illustrated in the accompanying drawings. Referring generally to FIGS. 1A through 6, a system and method for generating and utilizing programmed defects in a multi-pattern structure is described in accordance with the present disclosure.

Embodiments of the present disclosure are directed to a system for generating designed, or programmed defects, in one or more patterns of a multi-pattern structure. Additional embodiments of the present disclosure are directed to an imaged-based metrology tool, such as an SEM, which utilizes the programmed defects, formed in one or more layers of a multi-layer structure, as a marker to differentiate between layers in a multi-layer structure.

Figure 1A:
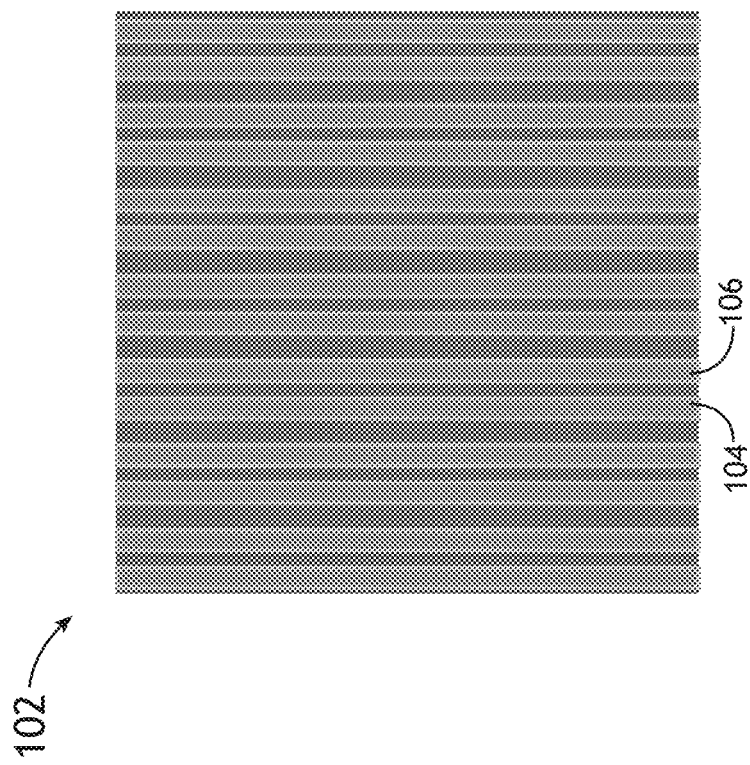
FIG. 1A illustrates a central portion of a multi-pattern line-array structure depicting the case where an overlay error exists between two line-pattern arrays of the multi-pattern array structure due to shifting of one of the layers and the inability to distinguish between the two line-pattern arrays, in accordance with one embodiment of the present disclosure.

Embodiments of the present disclosure address the difficulty associated with identifying patterns formed from different masks in an array that was formed with multiple patterning processes. The difficulty arises because after final patterning, all the patterns appear the same. In the case of overlay, if an overlay shift existed between layers, a metrology tool could not determine which layer incorrectly shifted. For example, FIG. 1A depicts the case where an overlay error exists between two layers of a line-space array 102 due to shifting of one of the layers. In this example, two different line arrays 104, 106 are formed in an interleaving manner, whereby lines of a first pattern structure 104 are situated between the lines of a second pattern structure 106. When shifts in one of the line space arrays occurs, it is extremely difficult to determine which pattern structure shifted when measuring at the central portion of the multiple pattern structure.

Figure 1B:
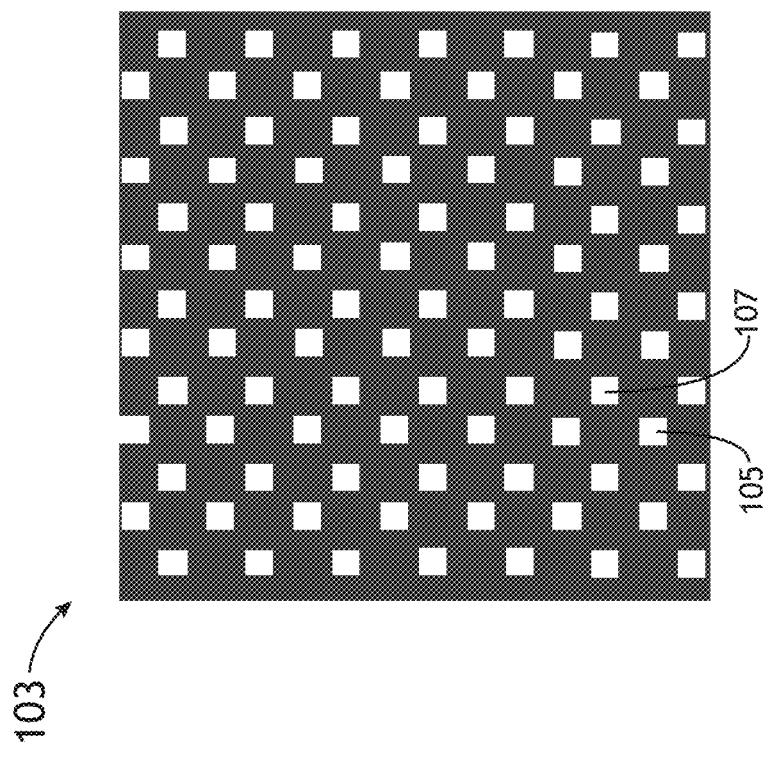
FIG. 1B illustrates a central portion of a contact array structure depicting the case where an overlay error exists between two pattern arrays of the contact array structure due to shifting of one of the layers and the inability to distinguish between the two pattern arrays, in accordance with one embodiment of the present disclosure.

By way of another example, FIG. 1B depicts the case where an overlay error exists between two layers of a lithography-etch-lithography-etch (LELE) contact array as a result of the shifting of one of the layers. As noted previously, it is difficult for a metrology tool to determine which layer incorrectly shifted.

Embodiments of the present disclosure allow SEM-based measurement of overlay error between litho-etch-litho-etch (LELE) multi-patterning layers by adding designed, SEM-detectable, defects (programmed defects) in one or more mask layers in array patterns. The programmed defects may be, but are not required to be, placed in scribe line areas, dummy fill areas, or in real device array areas. With precise location information from design data, an SEM metrology tool may be driven to the designed defects, acquire one or more SEM images, identify the patterns from different mask layers of multi-patterning, and measure overlay error between different masks. It is noted that these SEM images can also be used to measure critical dimension (CD) and critical dimension uniformity (CDU) of the structures in the array formed with different mask layers of the multi-patterning process. Embodiments of the present disclosure also enable the determination of the root cause of pitch walk of self-aligned double patterning (SADP) or self-aligned quadruple patterning (SAQP). This ability is critical for overlay measurement since meaningful measurement cannot be performed without distinguishing between a current layer and a previous layer.

Embodiments of the present disclosure adds a programmed defect in one of the array mats in one or more masks used in a multi-patterning process, which as noted above, aids in identifying the patterns in the array formed via the one or more masks. The programmed defects may be formed in array of a test pattern or a real device pattern.

Figure 2:
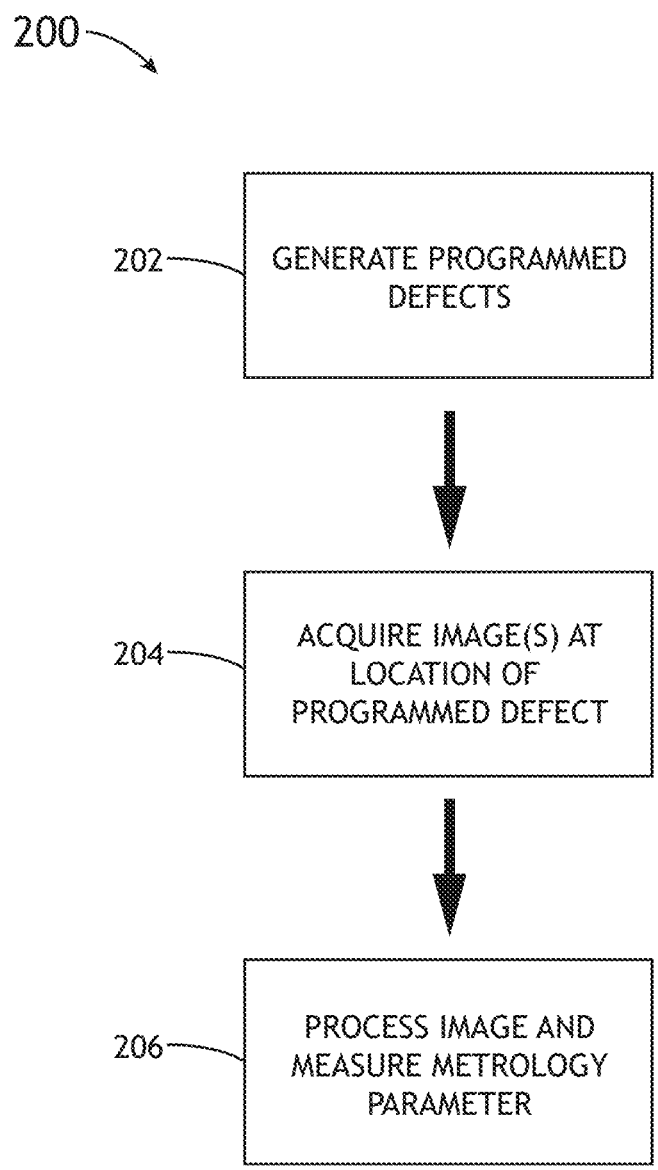
FIG. 2 illustrates a process flow depicting a method for the formation and use of one or more programmed defects in a multi-pattern array structure of a sample, in accordance with one or more embodiments of the present disclosure.

FIG. 2 illustrates a process flow 200 depicting the formation and use of one or more programmed defects, in accordance with one or more embodiments of the present disclosure. In step 202, one or more programmed defects are formed in one or more patterns of a multi-pattern structure on a sample. For example, one or more programmed defects may be added into an array mat of one or more masks used by a lithography tool. Then, the lithography tool may be used to form an array pattern containing the one or more programmed defects on the sample. In step 204, one or more images are acquired from the sample at a location of the programmed defect. For example, one or more imaging-based metrology tools, such as, but not limited to, an SEM may acquire on or more images of an array pattern at the location of the programmed defect. In step 206, the one or more images acquired from the array pattern at the location of the programmed defect are processed and one or more metrology parameters are measured. For example, based on the image data acquired from the array pattern at the location of the one or more programmed defects one or more metrology patterns, such as overlay error or CD/CDU are measured or determined.

Figure 3:
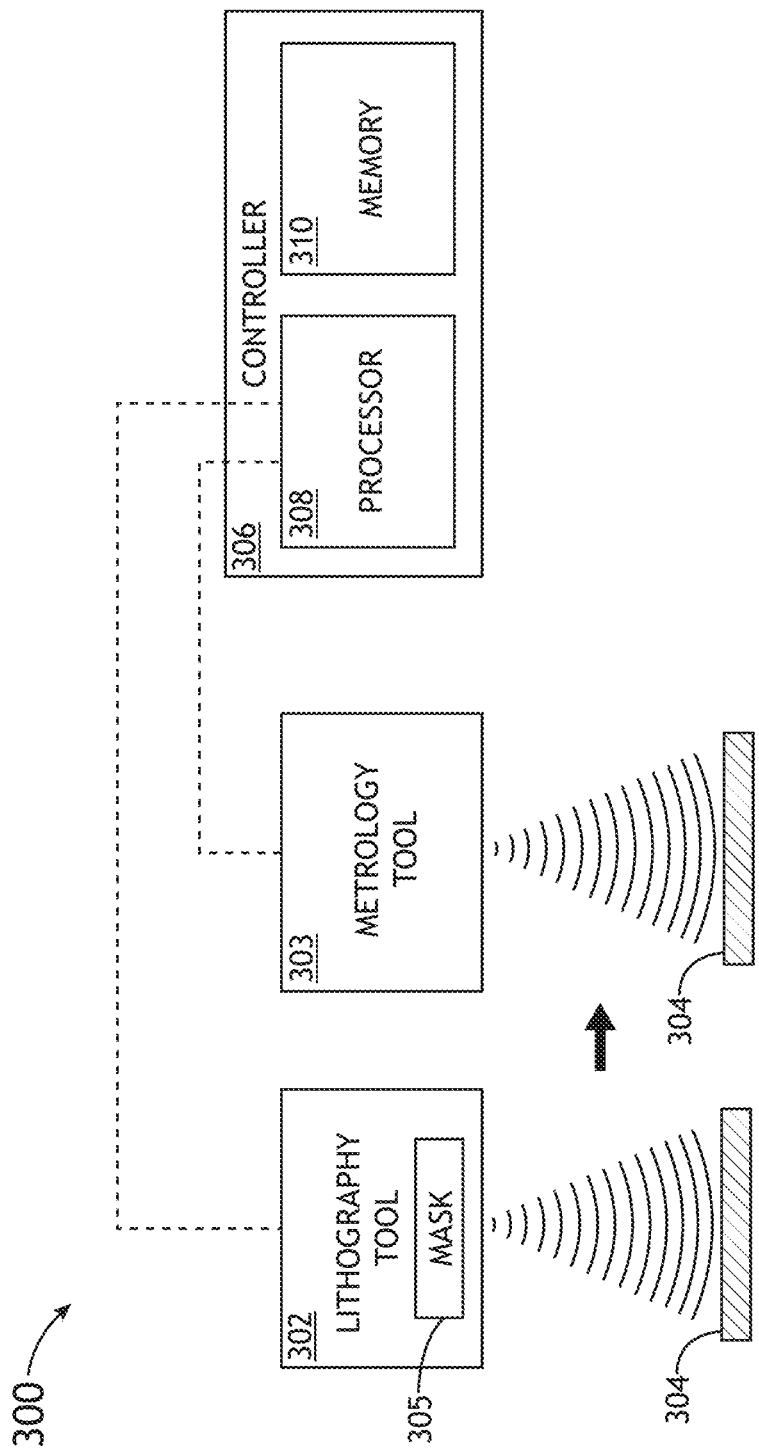
FIG. 3 illustrates a system for generating and utilizing programmed defects in a multi-pattern array structure of a sample, in accordance with one or more embodiments of the present disclosure.

FIG. 3 illustrates a system 300 for generating and utilizing programmed defects in one or more array structures of a sample, in accordance with one or more embodiments of the present disclosure. In one embodiment, the system 300 includes a lithography tool 302, an imaging-based metrology tool 303, and/or a controller 306.

In one embodiment, the lithography tool 302 is configured for forming multiple array patterns on one or more samples 304. For example, the lithography tool 302 may be configured to implement one or more masks 305. The one or more masks 305 may be used to form one or more selected array patterns on the sample 304. In one embodiment, the one or more masks 305 may be designed to include one or more programmed, or designed, defects in one or more array mats of the one or more masks 305. The lithography tool 302 may include any lithography tool known in the art of lithography, such as, but not limited to an electron-beam lithography tool or a UV lithography tool (e.g., EUV lithography tool).

In another embodiment, the system 300 includes a metrology tool 303 for acquiring one or more images of the multiple array patterns from the one or more samples 304. The metrology tool 303 may include any imaging-based metrology tool suitable for performing imaging-based overlay measurements and/or CD/CDU measurements on patterns formed on semiconductor sample. For example, the metrology tool 303 may include, but is not limited to, an SEM imaging tool.

In another embodiment, the system 300 includes a controller 306. The controller 306 may include one or more processors 308 configured to execute program instructions maintained on a memory device 310. In this regard, the one or more processors 308 of controller 306 may execute any of the various process steps described throughout the present disclosure. For example, the controller 306 may control one or more features of the lithography tool 302. By way of another example, the controller 106 may analyze and/or interpret metrology data from the metrology tool 303 to determine overlay and/or CD/CDU based on image data obtained from one or more portions of the multiple array patterns (e.g., multi-layer array structures) disposed on the sample 304, whereby one or more pattern structures of one of the layers of the multiple array patterns contains one or more programmed defects.

As depicted in FIG. 1A, in the case where two different pattern array structures are formed in an interleaving manner (i.e., lines of a first pattern structure are situated between the lines of a second pattern structure) it is difficult to determine which pattern structure has shifted.

FIGS. 4A-4H illustrate various implementations of one or more programmed defects in a patterned array, in accordance with one or more embodiments of the present disclosure. It is noted that the specific programmed defects and the implementation contexts depicted in FIGS. 4A-4H are provided merely for illustrative purposes and should not be interpreted as a limitation on the scope of the present disclosure. The programmed defects of the present disclosure may be extended to any multi-patterning lithographic context.

Figure 4B:
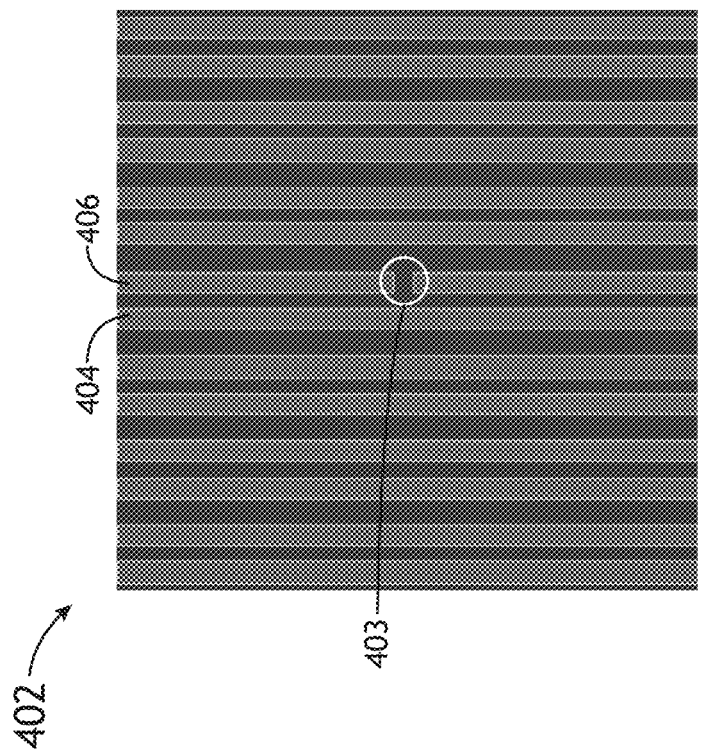
FIG. 4B illustrates a line-space array structure containing a programmed defect displaying an overlay error, in accordance with one or more embodiments of the present disclosure.
Figure 4A:
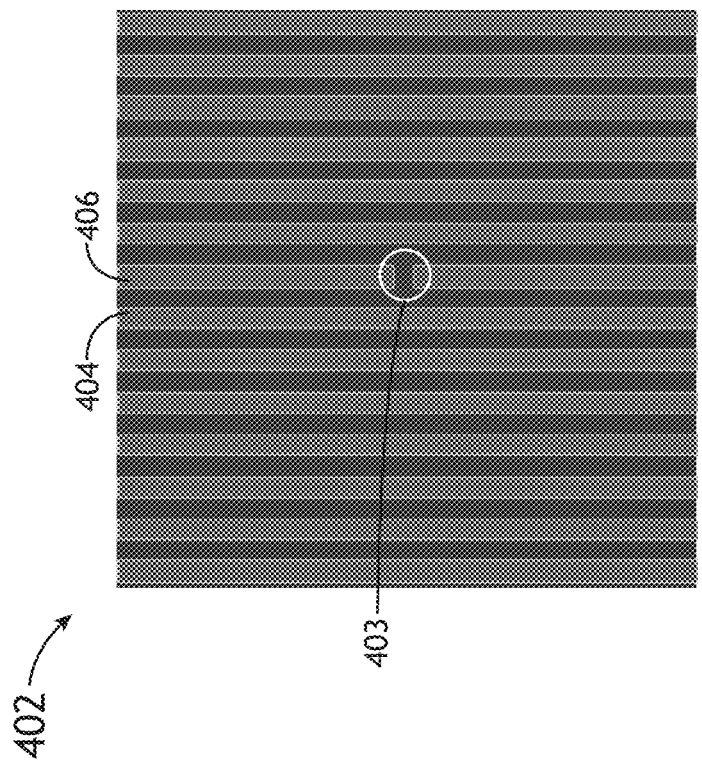
FIG. 4A illustrates a line-space array structure containing a programmed, or designed defect, in accordance with one or more embodiments of the present disclosure.

FIG. 4A depicts a line-space array structure 402 containing a designed defect 403, in accordance with one or more embodiments of the present disclosure. In one embodiment, the lithography tool 302 may form the line-space array such that it includes a first line array 404 and a second line array 406. For example, an array mat of one or more masks 305 utilized within the lithography tool 302 include a programmed defect/feature such that a corresponding defect/feature is formed on the sample 304 during lithographic processing. In this example, the programmed defect is placed within one or more of the lines of the second line array 406. FIG. 4B depicts the line-space array structure 402 displaying an overlay error in the masks 305 used to form the array structure 402, in accordance with one or more embodiments of the present disclosure. The inclusion of the programmed defect 403 in one of the line arrays allows for improved distinction between the first line array 404 and the second line array 406 by imaging techniques. For example, the metrology tool 303 may acquire the image of the line-space array structure 402 equipped with the programmed defect 403, such as that shown in FIGS. 4A-4B. Then, due to the ability to distinguish between line array 404 and line array 406, the controller 306 may determine whether an overlay error exists in the pattern structure and which line array shifted.

In one embodiment, the metrology tool 303 may be configured to obtain an image having a large field of view (FOV) in the location of the programmed defect 403. In another embodiment, one or more image feature detection algorithms are executed by the controller 306 to identify the programmed defect 403. Once the programmed defect 403 has been identified, the controller 306 may direct the metrology tool 303 to zoom in on the programmed defect 403 and acquire a high resolution, small FOV image to carry out the measurement (e.g., CDU or overlay) of patterns formed with different masks.

Figure 4D:
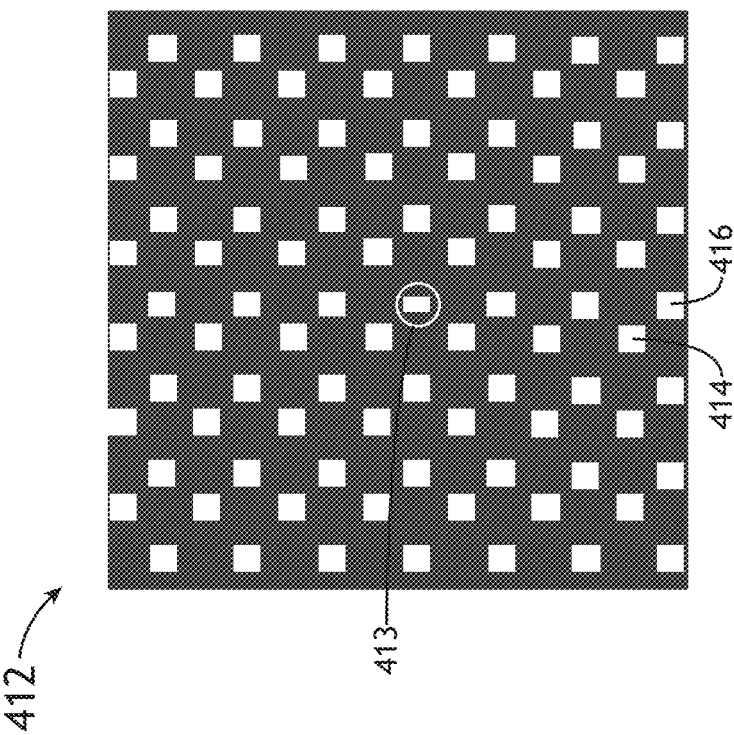
FIG. 4D illustrates a contact array structure displaying an overlay, in accordance with one or more embodiments of the present disclosure.
Figure 4C:
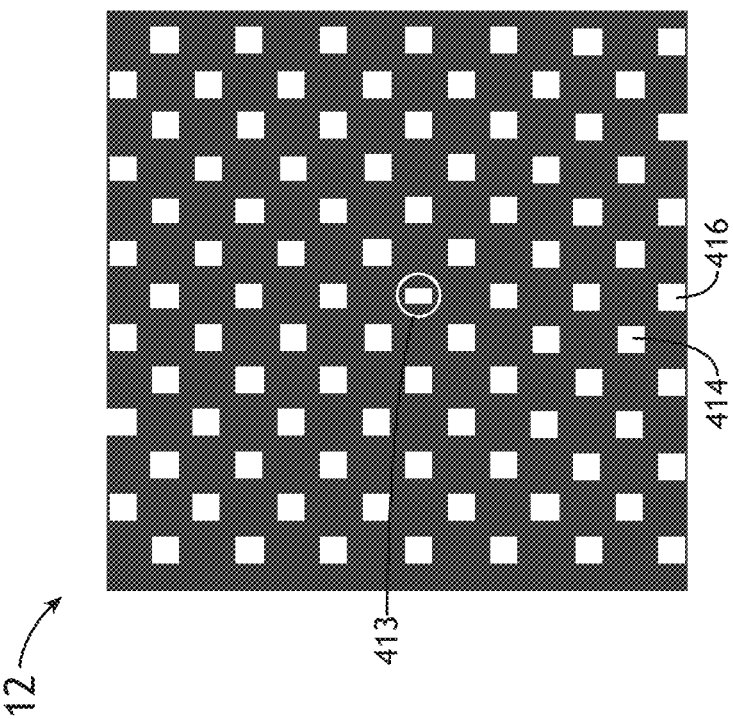
FIG. 4C illustrates a contact array structure containing a programmed defect, in accordance with one or more embodiments of the present disclosure.

FIG. 4C depicts a contact array structure 412 containing a designed defect 413, in accordance with one or more embodiments of the present disclosure. For example, the contact array structure 412 may include, but is not limited to, an LELE contact array structure. In one embodiment, the lithography tool 302 may form the contact array structure 412 such that it includes a first array 414 of elements and a second array 416 of elements. As shown in FIG. 4C, in one embodiment, the first array 414 of elements and the second array 416 of elements are evenly interspersed when no misalignment is present.

FIG. 4D depicts the contact array structure 412 displaying an overlay error in the masks 305 used to form the array structure 412, in accordance with one or more embodiments of the present disclosure. Again, the inclusion of the programmed defect 413 in one of the arrays 416 allows for improved distinction between the first array 414 and the second array 416 by imaging techniques. For example, the metrology tool 303 may acquire the image of the contact array structure 412 equipped with the programmed defect 413. Then, due to the ability to distinguish between array 414 and array 416, the controller 306 may determine whether an overlay error exists between the two arrays 414, 416 and, if so, which array shifted.

Figure 4E:
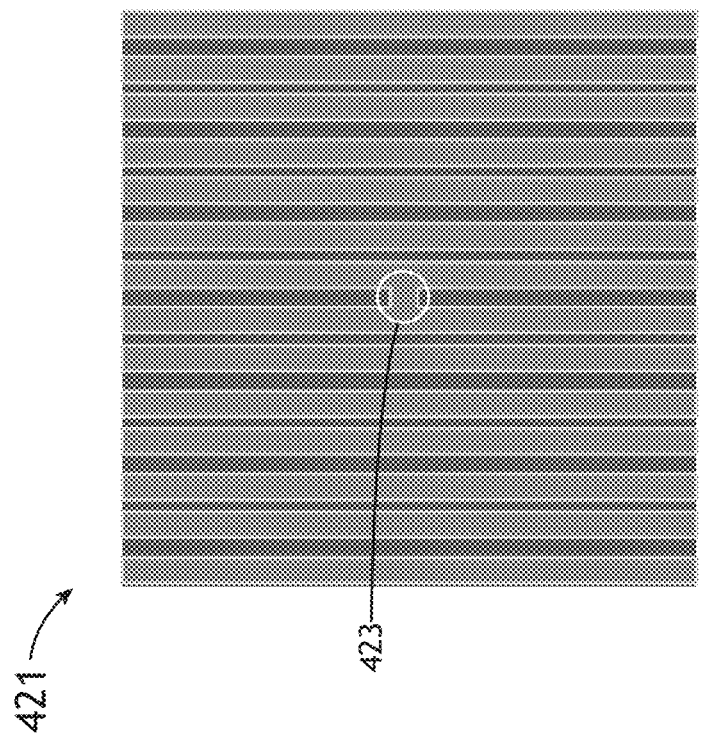
FIG. 4E illustrates a self-aligned double pattern (SADP) structure depicting the difficulty in identifying the root cause associated with pitch walk of the SADP in the context of space thickness variation and an SADP structure formed with a programmed defect, in accordance with one or more embodiments of the present disclosure.
Figure 4E:
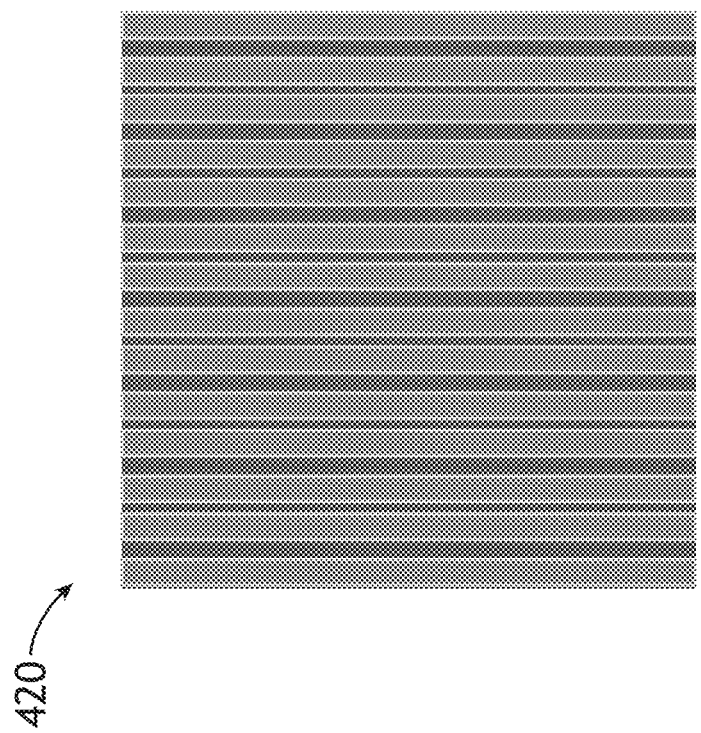

FIG. 4E depicts a self-aligned double pattern (SADP) structure 420 illustrating the difficulty in identifying the root cause associated with the pitch walk of the SADP in the context of space thickness variation, in accordance with one or more embodiments of the present disclosure. In addition, FIG. 4E depicts an SADP structure 421 formed with a bridge defect 423. The use of the bridge defect 423 allows the system 300 to determine the root cause associated with the observed pitch walk. As shown in FIG. 4E, the use of the bridge defect 423 allows the system 300 to determine whether the root cause of the pitch walk is associated with space thickness variation.

FIG. 4F depicts an SADP structure 424 illustrating the difficulty in identifying the root cause associated with the pitch walk of the SADP in the context of mandrel CD variation, in accordance with one or more embodiments of the present disclosure. In addition, FIG. 4F depicts an SADP structure 425 formed with a bridge defect 423. As shown in FIG. 4F, the use of the bridge defect 423 allows the system 300 to determine whether the root cause of the pitch walk is associated with mandrel CD variation.

FIG. 4G depicts a self-aligned quadruple pattern (SAQP) structure 430 illustrating the difficulty in identifying the root cause associated with the pitch walk of the SAQP, in accordance with one or more embodiments of the present disclosure. FIG. 4H depicts an SAQP structure 432 formed with a bridge defect 423, in accordance with one or more embodiments of the present disclosure.

The use of a programmed defect in the context of self-aligned double patterning or self-aligned quadruple patterning structures allow the controller 306 and user to determine the root cause of pitch in these structures. It is noted that SADP has two variables: mandrel CD and spacer thickness, while SAQP has three variables: mandrel CD, 1st spacer thickness and 2nd spacer thickness.

Generally, the implementation of the programmed defects of the present disclosure throughout various stages of the lithographic process allow the system 300 to identify the root cause of CDU and/or overlay errors. For example, with utilization of the programmed defects (and the subsequent analysis as described throughout the present disclosure) the system 300 may determine what process step or tool is the cause of an overlay error and/or CDU. For instance, the use of one or more programmed defects allow the system 300 to determine whether a given metrological issue (e.g., overlay error, CDU, or the like) is caused by a lithographic step (i.e., a scanner), thin film deposition, a chemical-mechanic planarization (CMP) step, or an etch step. For example, the use of one or more programmed defects, as described throughout the present disclosure, may allow the system 300 to determine the of an etch tool or CMP tool on a particular layer is the cause of a particular metrology issue (e.g., overlay error or CDU).

Figure 4I:
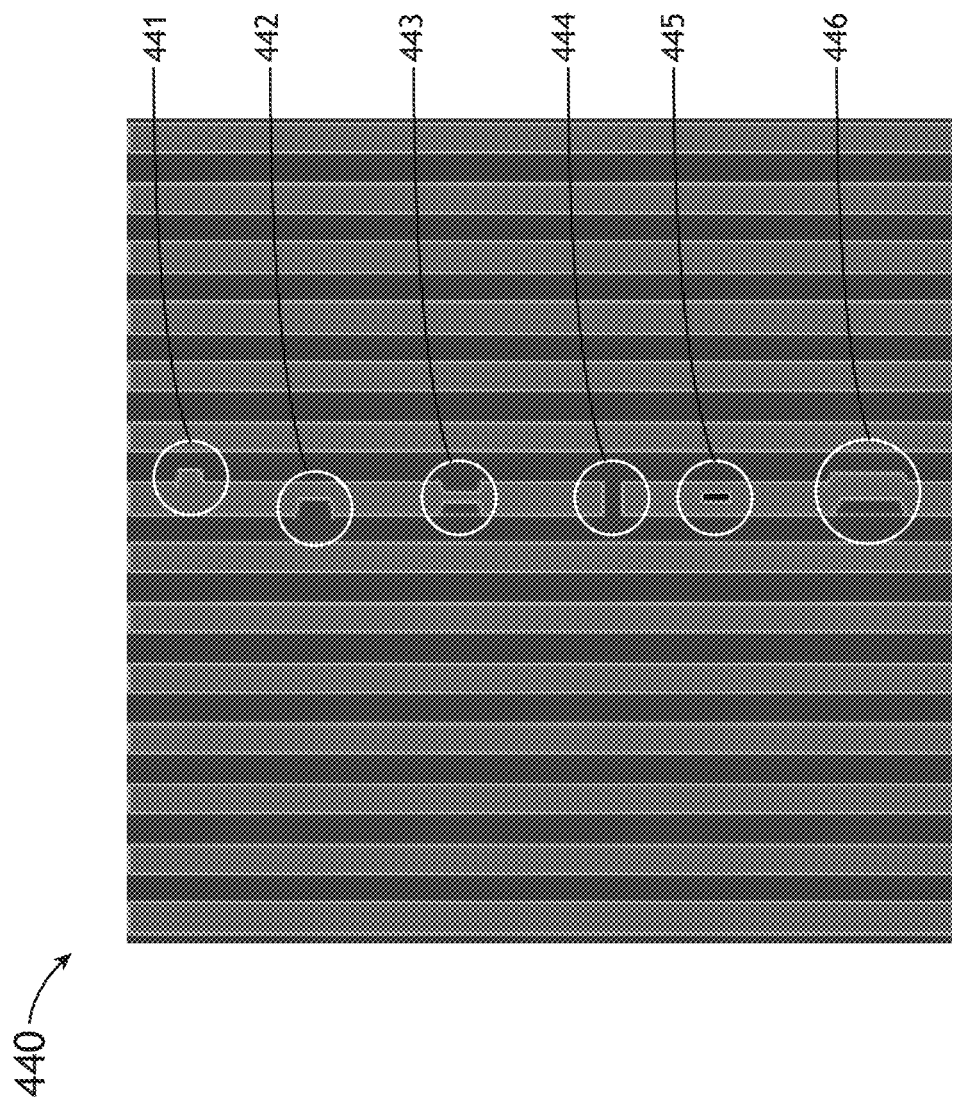
FIG. 4I illustrates a line-space array structuring depicting various types of possible programmed defects, in accordance with one or more embodiments of the present disclosure.

FIG. 4I illustrates a line-space array structuring depicting various types of possible programmed defects, in accordance with one or more embodiments of the present disclosure. It is noted that, while a broken-line or gap type defect has been depicted throughout the present disclosure, this particular type of programmed defect type is not a limitation on the scope of the present disclosure. It is recognized herein that various types of programmed, or designed, defects may be implemented in the various embodiments of the present disclosure. In one embodiment, the programmed defect of the present disclosure may include a protrusion 441 in one or more of the pattern structures. In another embodiment, the programmed defect of the present disclosure may include an intrusion 442, or "mouse bite," in one or more of the pattern structures. In another embodiment, the programmed defect of the present disclosure may include a necking or pinching defect 443 in one or more of the pattern structures. In another embodiment, the programmed defect of the present disclosure may include a broken line or gap defect 444 in one or more of the pattern structures. In another embodiment, the programmed defect of the present disclosure may include a pinhole defect 445 in one or more of the pattern structures. In another embodiment, the programmed defect of the present disclosure may include a bending-line defect 446 in one or more of the pattern structures.

While the various defect types 441-446 of FIG. 4I are illustrated on a single line of a single multi-pattern structure, it is noted herein that such an arrangement is not a limitation on the scope of the present disclosure and is provided merely for simplicity. It is noted herein that any of the defects of the present disclosure may be used alone or in conjunction with one or more other defects in any multi-pattern structure known in the art of semiconductor device manufacture.

Figure 5:
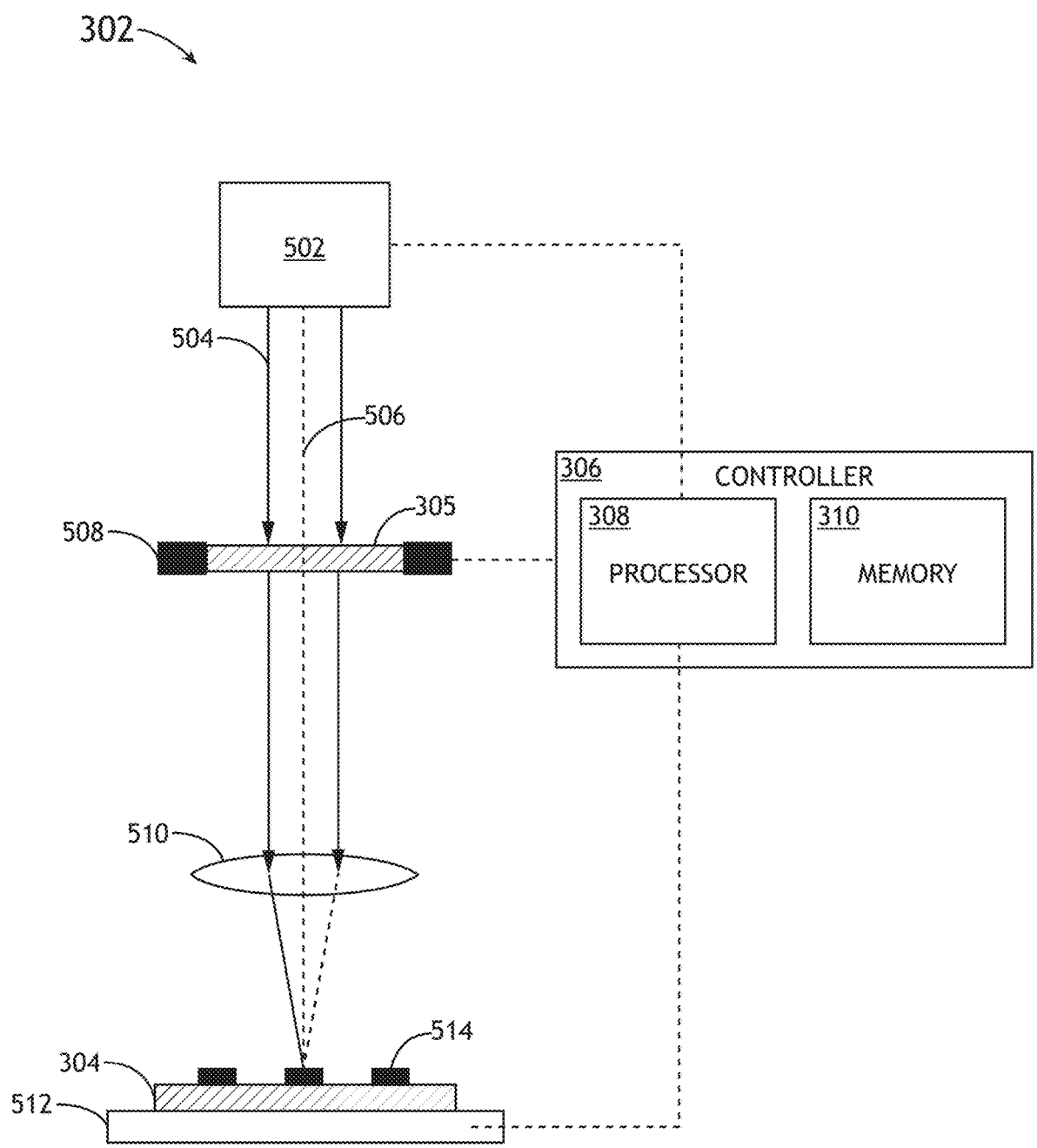
FIG. 5 illustrates a conceptual view of a lithography tool for generating a multi-pattern array structure containing one or more programmed defects on a sample, in accordance with one or more embodiments of the present disclosure.

FIG. 5 is a conceptual view of the lithography tool 302 of system 300, in accordance with one or more embodiments of the present disclosure. The lithography tool 302 may include any lithography tool known in the art of lithographic pattern generation. In one embodiment, the lithography tool 302 may include an optical lithography tool. For example, as shown in FIG. 5, the lithography tool 302 may include an optical lithography tool configured to operate in conjunction with a transmissive mask. By way of another example, although not shown, the lithography tool 302 may include an optical lithography tool configured to operate in conjunction with a reflective mask. In the case of optical-based lithography, the lithography tool 302 may include, but is not limited to, an illumination source 502 configured to generate one or more illumination beams 504 along an optical axis 506. The one or more illumination beams 504 may include one or more selected wavelengths of light including, but not limited to, extreme ultraviolet radiation (EUV), vacuum ultraviolet radiation (VUV), ultraviolet (UV) radiation, visible radiation, or infrared (IR) radiation. In another embodiment, the lithography tool 302 may include an electron-beam lithography tool. For example, although not depicted, the lithography tool 302 may include an electron-beam lithography tool configured to operate in conjunction with a reflective mask. In this embodiment, the lithography tool 302 may include an electron beam source, such as, but not limited to, one or more electron guns.

In another embodiment, the lithography tool 302 includes a mask support device 508. The mask support device 508 is configured to secure the pattern mask 305. In another embodiment, the lithography tool 302 includes a set of projection optics configured to project an image of the pattern mask 305 illuminated by the one or more illumination beams 504 onto the sample 304 disposed on a sample stage 512 in order to generate printed pattern elements corresponding to the image of the pattern mask 305. In another embodiment, the mask support device 508 may be configured to actuate or position the pattern mask 305. For example, the mask support device 508 may actuate the pattern mask 305 to a selected position with respect to the projection optics of the lithography tool 302.

The sample 304 may include any number of photosensitive materials and/or material layers suitable for receiving the image of the pattern mask 305. For example, the sample 304 may include a resist layer 514. In this regard, the set of projection optics may project an image of the pattern mask 305 onto the resist layer 514 to expose the resist layer 514. A subsequent etching step may remove the exposed material (e.g. positive etching) or the unexposed material (e.g. negative etching) in order to provide printed features on the sample 304. Further, the pattern mask 305 may be utilized in any imaging configuration known in the art. For example, the pattern mask 305 may be a positive mask (e.g. a bright-field mask) in which pattern elements are positively imaged as printed pattern elements. By way of another example, the pattern mask 305 may be a negative mask (e.g. a dark-field mask) in which pattern elements of the pattern mask 305 form negative printed pattern elements (e.g. gaps, spaces, or the like).

The controller 306 may be communicatively coupled to the mask support device 508 and/or the sample stage 512 to direct the transfer of pattern elements on the pattern mask 305 to the sample 304.

Figure 6:
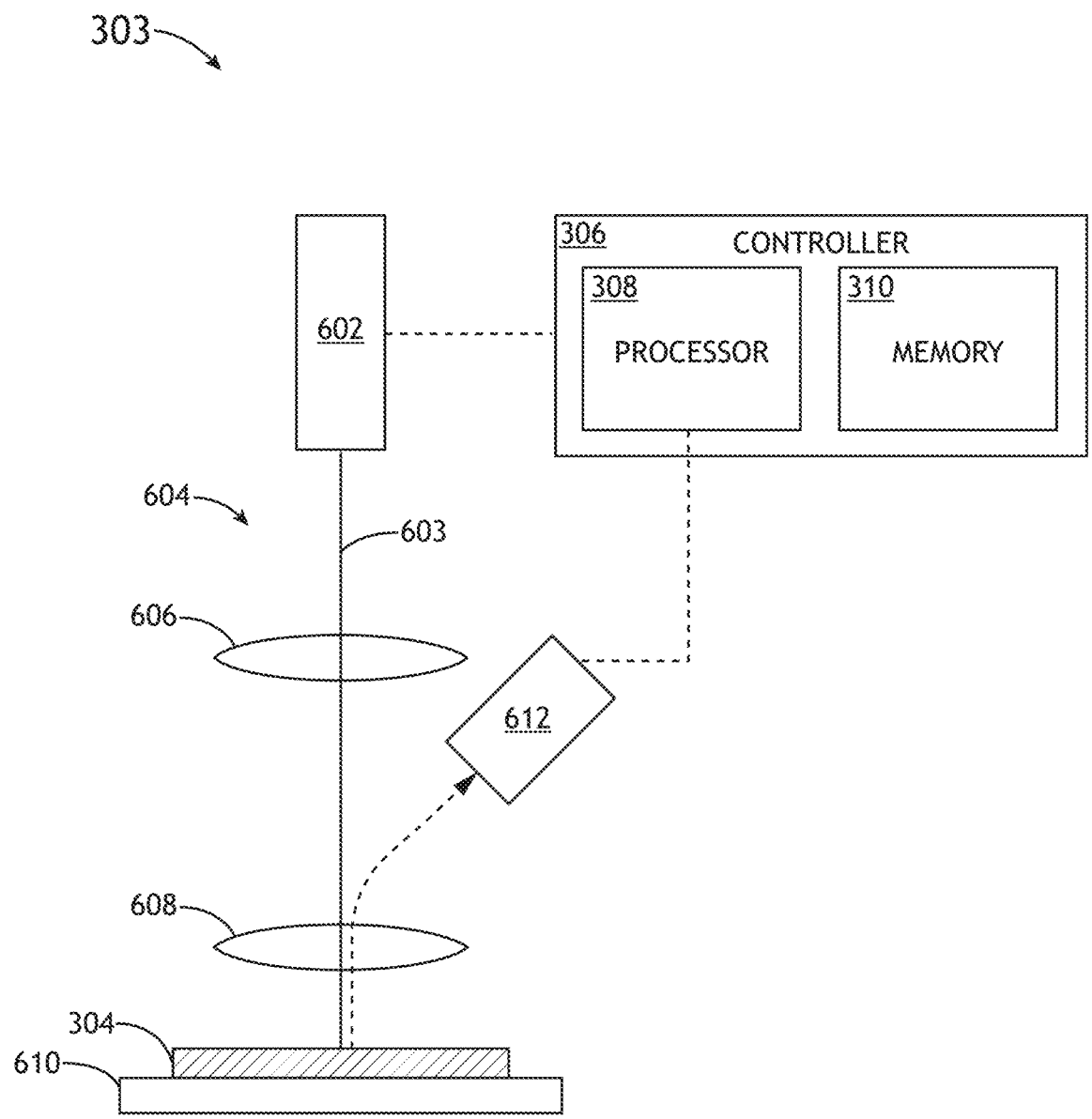
FIG. 6 illustrates a conceptual view of a metrology tool for measuring one or more metrology parameters of a multi-pattern array structure containing one or more programmed defects, in accordance with one or more embodiments of the present disclosure.

FIG. 6 illustrates the metrology tool 303 arranged for performing SEM-based metrology on the multi-pattern structure of sample 304, in accordance with one embodiment of the present disclosure.

In one embodiment, the metrology tool 303 includes an electron beam source 602 for generating one or more electron beams 603. The electron beam source 602 may include any electron source known in the art. For example, the electron beam source 602 may include, but is not limited to, one or more electron guns. For instance, the electron beam source 602 may include a single electron gun for generating a single primary electron beam 603. In another instance, the electron beam source 602 may include multiple electron guns for generating multiple primary electron beams.

In another embodiment, the metrology tool 303 includes a sample stage 610. The sample stage 610 secures the sample 304. The sample 304 may include any sample suitable for image-based metrology with electron-beam microscopy, such as, but not limited to, a semiconductor wafer (e.g., silicon wafer). In another embodiment, the sample stage 610 is an actuatable stage. For example, the sample stage 610 may include, but is not limited to, one or more translational stages suitable for selectively translating the sample 304 along one or more linear directions (e.g., x-direction, y-direction, and/or z-direction). By way of another example, the sample stage 610 may include, but is not limited to, one or more rotational stages suitable for selectively rotating the sample 304 along a rotational direction. By way of another example, the sample stage 610 may include, but is not limited to, a rotational stage and a translational stage suitable for translating the sample along a linear direction and/or rotating the sample 304 along a rotational direction.

In another embodiment, the metrology tool 303 includes a detector assembly 612. For example, the detector assembly 612 may include, but is not limited to, a secondary electron detector. By way of another example, the detector assembly 612 may include, but is not limited to, a back-scattered electron detector. It is noted that that the detector assembly 612 may include any type of electron detector known in the art. In one embodiment, secondary electrons may be collected and imaged using an Everhart-Thornley detector (or other type of scintillator-based detector). In another embodiment, electrons may be collected and imaged using a microchannel plate (MCP). In another embodiment, electrons may be collected and imaged using a PIN or p-n junction detector, such as a diode or a diode array. In another embodiment, electrons may be collected and imaged using one or more avalanche photo diodes (APDs).

In another embodiment, the metrology tool 303 includes a set of electron-optical elements. The set of electron-optical elements 604 may form an electron-optical column defined by an optical axis as shown in FIG. 6. For purposes of simplicity, a single electron-optical column is depicted in FIG. 6. It is noted herein that this configuration should not be interpreted as a limitation on the present disclosure. For example, the metrology tool 303 may include multiple electron-optical columns.

The set of electron-optical elements 604 may direct at least a portion of the primary electron beam 603 onto a selected portion of the multi-pattern structure containing the programmed defect formed on the sample 304. The set of electron-optical elements may include any electron-optical elements known in the art of SEM-based metrology. In one embodiment, the set of electron-optical elements 604 includes one or more electron-optical lenses. For example, the one or more electron-optical lenses may include, but are not limited to, one or more condenser lenses 606 for collecting electrons from the electron beam source 602. By way of another example, the electron-optical lenses may include, but are not limited to, one or more objective lenses 608 for focusing the primary electron beam 603 onto a selected region of the sample 304.

The one or more processors 308 of controller 306 may include any one or more processing elements known in the art. In this sense, the one or more processors 308 may include any microprocessor-type device configured to execute software algorithms and/or instructions. In one embodiment, the one or more processors 308 may consist of a desktop computer, mainframe computer system, workstation, image computer, parallel processor, or other computer system (e.g., networked computer) configured to execute a program configured to operate the system 300, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 310. Moreover, different subsystems of the system 300 (e.g., lithography tool, metrology tool, process tool, display or user interface) may include processor or logic elements suitable for carrying out at least a portion of the steps described throughout the present disclosure. Therefore, the above description should not be interpreted as a limitation on the present disclosure but merely an illustration.

The memory medium 310 may include any storage medium known in the art suitable for storing program instructions executable by the associated one or more processors 308. For example, the memory medium 310 may include a non-transitory memory medium. For instance, the memory medium 310 may include, but is not limited to, a read-only memory, a random-access memory, a magnetic or optical memory device (e.g., disk), a magnetic tape, a solid state drive and the like. In another embodiment, the medium 310 is configured to store one or more results from the lithography tool 302 or metrology tool and/or the output of the various steps described herein. It is further noted that medium 310 may be housed in a common controller housing with the one or more processors 308. In an alternative embodiment, the medium 310 may be located remotely with respect to the physical location of the processors 308 and controller 306.

In another embodiment, the system 300 includes a user interface. In one embodiment, the user interface is communicatively coupled to the one or more processors 308 of controller 306. In another embodiment, the user interface may be utilized by controller 306 to accept selections and/or instructions from a user. In some embodiments, a display may be used to display data to a user. In turn, a user may input selection and/or instructions responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel mounted input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present disclosure.

The display device may include any display device known in the art. In one embodiment, the display device may include, but is not limited to, a liquid crystal display (LCD), an organic light-emitting diode (OLED) based display or a CRT display. Those skilled in the art should recognize that a variety of display devices may be suitable for implementation in the present disclosure and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present disclosure.

In some embodiments, the controller 306 of the system 300 described herein may be configured as a "stand alone tool" or a tool that is not physically coupled to a process tool. In other embodiments, the controller 306 may be coupled to a process tool, inspection tool, or a metrology tool by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of metrology and/or inspection performed by the systems described herein may be used to alter a parameter of a process or a process tool of a semiconductor fabrication process using a feedback control technique, a feedforward control technique, and/or an in-situ control technique. The parameter of the process or the process tool may be altered manually or automatically All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and/or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

What is claimed:

1. A system comprising:
   a lithography tool configured to form a multi-pattern structure including a first periodic array pattern in a first layer and a second array pattern in a second layer on a sample, wherein at least one of the first array pattern in the first layer or the second array pattern in the second layer contains a programmed defect to change the pattern of the first array pattern relative to the second array pattern to differentiate the first array pattern from the second array pattern;
   a metrology tool configured to acquire one or more images of the first array pattern and the second array pattern having a field-of-view containing the programmed defect; and
   a controller including one or more processors, wherein the one or more processors are configured to cause the one or more processors to execute a set of program instructions contained in memory, wherein the set of program instructions are configured to cause the one or more processors to:
   receive the one or more images of the first array pattern and the second array pattern containing the programmed defect from the metrology tool; and
   determine one or more metrology parameters associated with at least one of the first array pattern and the second array pattern based on the one or more images of the first array pattern and the second array pattern containing the programmed defect.

2. The system of claim 1, wherein the determining one or more metrology parameters associated with at least one of the first array pattern and the second array pattern comprises:
determining an overlay error between the first array pattern and the second array pattern.

3. The system of claim 1, wherein the determining one or more metrology parameters associated with at least one of the first array pattern and the second array pattern comprises:
determining a critical dimension (CD) of at least one of the first array pattern and the second array pattern.

4. The system of claim 1, wherein the determining one or more metrology parameters associated with at least one of the first array pattern and the second array pattern comprises:
determining critical dimension uniformity (CDU) of at least one of the first array pattern and the second array pattern.

5. The system of claim 1, wherein the programmed defect comprises:
at least one of a protrusion defect, an intrusion defect, a pinching defect, a gap defect, a pinhole defect, a bending defect, or a bridging defect.

6. The system of claim 1, wherein the programmed defect is formed in at least one of a scribe-line area, a dummy-fill area, or a real device area of the sample.

7. The system of claim 1, wherein the lithography tool comprises:
at least one of an extreme ultraviolet (EUV) lithography tool or an electron-beam lithography tool.

8. The system of claim 1, wherein the metrology tool comprises:
a scanning electron microscopy (SEM) metrology tool.

9. The system of claim 1, wherein the sample comprises:
a semiconductor wafer.

10. A lithography tool comprising:
an illumination source;
a mask stage configured to secure one or more pattern masks;
a sample stage configured to secure a sample; and
a set of optics configured to direct illumination from the illumination source to the one or more pattern masks to project two or more patterns from the one or more pattern masks onto the sample,
wherein the one or more pattern masks includes at least one array pattern containing one or more programmed defects, wherein the one or more pattern masks are configured to form a first array pattern in a first layer and a second array pattern in a second layer on the sample, wherein at least one of the first array pattern or the second array pattern contains a programmed defect to change the pattern of the first array pattern relative to the second array pattern to differentiate the first array pattern from the second array pattern.

11. The lithography tool of claim 10, further comprising:
a controller.

12. The lithography tool of claim 11, wherein the controller is configured to determine one or more metrology parameters associated with at least one of the first array pattern and the second array pattern.

13. The lithography tool of claim 12, wherein the controller is further configured to determine an overlay error between the first array pattern and the second array pattern.

14. The lithography tool of claim 12, wherein the controller is further configured to determine a critical dimension (CD) of at least one of the first array pattern and the second array pattern.

15. The lithography tool of claim 12, wherein the controller is further configured to determine a critical dimension uniformity (CDU) of at least one of the first array pattern and the second array pattern.

16. The lithography tool of claim 10, wherein the programmed defect comprises:
at least one of a protrusion defect, an intrusion defect, a pinching defect, a gap defect, a pinhole defect, a bending defect, or a bridging defect.

17. The lithography tool of claim 10, wherein the lithography tool forms the programmed defect in at least one of a scribe-line area, a dummy-fill area, or a real device area of the sample.

18. The lithography tool of claim 10, wherein the lithography tool comprises:
at least one of an extreme ultraviolet (EUV) lithography tool or an electron-beam lithography tool.

19. The lithography tool of claim 10, wherein the sample comprises:
a semiconductor wafer.

20. A metrology tool comprising:
an electron beam source configured to generate a primary electron beam;
a sample stage configured to secure a sample;
a set of electron-optical elements configured to direct at least a portion of the primary electron beam onto a portion of the sample;
a detector assembly configured to detect electrons emanating from one or more portions of two or more array patterns disposed on the sample, wherein at least one of a first array pattern in a first layer or a second array pattern in a second layer of the two or more array patterns contains a programmed defect to change the pattern of the first array pattern relative to the second array pattern to differentiate the first array pattern from the second array pattern; and
a controller including one or more processors, wherein the one or more processors are configured to cause the one or more processors to execute a set of program instructions contained in memory, wherein the set of program instructions are configured to cause the one or more processors to:
receive image data associated with the two or more array patterns from the detector assembly; and
determine one or more metrology parameters associated with the two or more array patterns based on the received image data.

21. The metrology tool of claim 20, wherein the controller is configured to determine one or more metrology parameters associated with at least one of the first array pattern and the second array pattern.

22. The metrology tool of claim 20, wherein the controller is further configured to determine an overlay error between the first array pattern and the second array pattern.

23. The metrology tool of claim 20, wherein the controller is further configured to determine a critical dimension (CD) of at least one of the first array pattern and the second array pattern.

24. The metrology tool of claim 20, wherein the controller is further configured to determine a critical dimension uniformity (CDU) of at least one of the first array pattern and the second array pattern.

25. The metrology tool of claim 20, wherein the programmed defect comprises:
at least one of a protrusion defect, an intrusion defect, a pinching defect, a gap defect, a pinhole defect, a bending defect, or a bridging defect.

26. The metrology tool of claim 20, wherein the programmed defect is formed in at least one of a scribe-line area, a dummy-fill area, or a real device area of the sample.

27. The metrology tool of claim 20, wherein the metrology tool comprises:
a scanning electron microscopy (SEM) metrology tool.

28. The metrology tool of claim 20, wherein the sample comprises:
a semiconductor wafer.

29. A metrology target comprising:
a first array pattern formed in a first layer on a sample; and
a second array pattern formed in a second layer on the sample, wherein at least one of the first array pattern or the second array pattern includes a programmed defect to change the pattern of the first array pattern relative to the second array pattern to differentiate the first array pattern from the second array pattern in one or more images of the metrology target.

30. The metrology target of claim 29, wherein the programmed defect comprises:
at least one of a protrusion defect, an intrusion defect, a pinching defect, a gap defect, a pinhole defect, a bending defect, or a bridging defect.

31. The metrology target of claim 29, wherein the programmed defect is formed in at least one of a scribe-line area, a dummy-fill area, or a device area of the sample.

32. The metrology target of claim 29, wherein at least one of the first array pattern or the second array pattern comprise:
a line array pattern.

33. The metrology target of claim 29, wherein at least one of the first array pattern or the second array pattern comprise:
a two-dimensional array of pattern elements.

34. The metrology target of claim 29, wherein the first array pattern and the second array pattern are configured for measurement with a metrology tool.

35. The metrology target of claim 34, wherein the first array pattern and the second array pattern are configured for one or more overlay measurements with an imaging-based overlay metrology tool.

36. The metrology target of claim 34, wherein the first array pattern and the second array pattern are configured for one or more critical dimension uniformity measurements with a critical dimensional metrology tool.

37. The metrology target of claim 34, wherein the metrology tool comprises:
a scanning electron microscopy (SEM) metrology tool.

38. The metrology target of claim 29, wherein the sample comprises:
a semiconductor wafer.

* * * * *